(12) United States Patent
Park et al.

(10) Patent No.: US 9,491,847 B2
(45) Date of Patent: Nov. 8, 2016

(54) MULTILAYER CERAMIC ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Sang Soo Park, Suwon-Si (KR);
Byoung Hwa Lee, Suwon-Si (KR);
Young Ghyu Ahn, Suwon-Si (KR);
Heung Kil Park, Suwon-Si (KR);
Hyun Sub Oh, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/921,867

(22) Filed: Oct. 23, 2015

(65) Prior Publication Data
US 2016/0205769 A1   Jul. 14, 2016

(30) Foreign Application Priority Data

Jan. 8, 2015   (KR) .................. 10-2015-0002676

(51) Int. Cl.
| | |
|---|---|
| *H01G 4/224* | (2006.01) |
| *H05K 1/02* | (2006.01) |
| *H01G 4/12* | (2006.01) |
| *H01G 4/236* | (2006.01) |
| *H01G 4/30* | (2006.01) |
| *H05K 1/18* | (2006.01) |
| *H05K 1/03* | (2006.01) |

(52) U.S. Cl.
CPC .............. *H05K 1/0213* (2013.01); *H01G 4/12* (2013.01); *H01G 4/224* (2013.01); *H01G 4/236* (2013.01); *H01G 4/30* (2013.01); *H05K 1/0271* (2013.01); *H05K 1/0306* (2013.01); *H05K 1/181* (2013.01); *H05K 2201/10015* (2013.01); *H05K 2201/10378* (2013.01); *H05K 2201/2045* (2013.01)

(58) Field of Classification Search
CPC ........ H01G 4/12; H01G 4/224; H01G 4/248; H01G 4/236; H01G 4/30; H05K 1/181; H05K 1/0213; H05K 1/0231
USPC ............... 361/763, 301.1, 301.3, 306.1, 310, 361/321.2; 174/260
See application file for complete search history.

(56) References Cited

U.S. PATENT DOCUMENTS

| | | |
|---|---|---|
| 2008/0019081 A1 | 1/2008 | Kim et al. |
| 2011/0002084 A1* | 1/2011 | Lee ........................ H01G 9/016 361/502 |

(Continued)

FOREIGN PATENT DOCUMENTS

| | | |
|---|---|---|
| KR | 10-2008-0007874 A | 1/2008 |
| KR | 10-2008-0071433 A | 8/2008 |

*Primary Examiner* — Hoa C Nguyen
(74) *Attorney, Agent, or Firm* — McDermott Will & Emery LLP

(57) ABSTRACT

A multilayer ceramic electronic component includes: a board including first and second contact terminals disposed on one surface thereof to be spaced apart from each other and first and second external terminals disposed on the other surface thereof to be spaced apart from each other; a multilayer ceramic capacitor including first and second external electrodes including first and second connection portions disposed on opposite end surfaces of a ceramic body and first and second band portions extending from the first and second connection portions to portions of one surface of the ceramic body and connected to the first and second contact terminals, respectively; a sealing part enclosing the multilayer ceramic capacitor on the board while exposing one ends of the first and second contact terminals; and first and second connection terminals connecting the ends of the first and second contact terminals to the first and second external terminals, respectively.

20 Claims, 14 Drawing Sheets

A-A'

(56) References Cited

U.S. PATENT DOCUMENTS

| | | | |
|---|---|---|---|
| 2011/0102972 A1* | 5/2011 | Jung | H01G 9/016 361/502 |
| 2011/0317331 A1* | 12/2011 | Lee | H01G 9/016 361/502 |
| 2012/0057274 A1* | 3/2012 | Kim | H01G 9/038 361/502 |
| 2012/0257324 A1* | 10/2012 | Ma | C04B 35/491 361/301.4 |
| 2013/0201037 A1* | 8/2013 | Glover | G08G 5/065 340/945 |

* cited by examiner

MULTILAYER CERAMIC ELECTRONIC COMPONENT AND BOARD HAVING THE SAME

CROSS-REFERENCE TO RELATED APPLICATION

This application claims the priority and benefit of Korean Patent Application No. 10-2015-0002676 filed on Jan. 8, 2015, with the Korean Intellectual Property Office, the disclosure of which is incorporated herein by reference.

BACKGROUND

The present disclosure relates to a multilayer ceramic electronic component and a board having the same.

A multilayer ceramic capacitor (MLCC), a multilayer electronic component, is mounted on printed circuit boards of several electronic products including display devices such as liquid crystal displays (LCDs), plasma display panels (PDPs), and the like, as well as including computers, smartphones, mobile phones, and personal digital assistants (PDAs), to serve to charge and discharge electricity therein or therefrom.

The multilayer ceramic capacitor (MLCC) may be used as a component of various electronic devices due to advantages such as a small size, high capacitance, and an ease of mounting.

The multilayer ceramic capacitor may have a structure in which a plurality of dielectric layers and internal electrodes disposed between the dielectric layers and having different polarities are alternately stacked.

Since the dielectric layers have piezoelectric and electrostrictive properties, when a direct current (DC) voltage or alternating current (AC) voltage is applied to the multilayer ceramic capacitor, a piezoelectric phenomenon may occur between the internal electrodes to generate vibrations while expanding and contracting a volume of a ceramic body depending on a frequency.

These vibrations may be transferred to a printed circuit board on which the multilayer ceramic capacitor is mounted through external electrodes of the multilayer ceramic capacitor, and thus the entirety of the circuit board becomes an acoustic reflective surface to generate a vibration sound, which is noise.

The vibration sound may be within an audio frequency range of 20 to 20,000 Hz, which may cause listener discomfort and is referred to as acoustic noise.

Meanwhile, in a case in which a multilayer ceramic capacitor is used in industrial/electrical fields, a strict reliability specification of the multilayer ceramic capacitor is required, and high reliability of the multilayer ceramic capacitor is particularly required under high temperature and mechanical environments.

According to the related art, a metal frame has been used in order to satisfy high reliability of the multilayer ceramic capacitor. However, in a case in which a metal frame is used, product costs have rapidly increased. In addition, a weight of the product has been excessively increased.

SUMMARY

An aspect of the present disclosure may provide a multilayer ceramic electronic component capable of decreasing acoustic noise and having high reliability at a low cost, and a board having the same.

According to an aspect of the present disclosure, a multilayer ceramic electronic component may include: a board including first and second contact terminals which are disposed on one surface thereof to be spaced apart from each other in a length direction, and first and second external terminals which are disposed on the other surface thereof to be spaced apart from each other in the length direction; a multilayer ceramic capacitor including first and second external electrodes including first and second connection portions which are disposed on opposite end surfaces of a ceramic body and first and second band portions which extend from the first and second connection portions to portions of one surface of the ceramic body in a thickness direction thereof, respectively, the first and second band portions being connected to the first and second contact terminals, respectively; a sealing part enclosing the multilayer ceramic capacitor on the board while exposing one ends of the first and second contact terminals; and first and second connection terminals connecting the exposed ends of the first and second contact terminals and the first and second external terminals to each other, respectively.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1A:
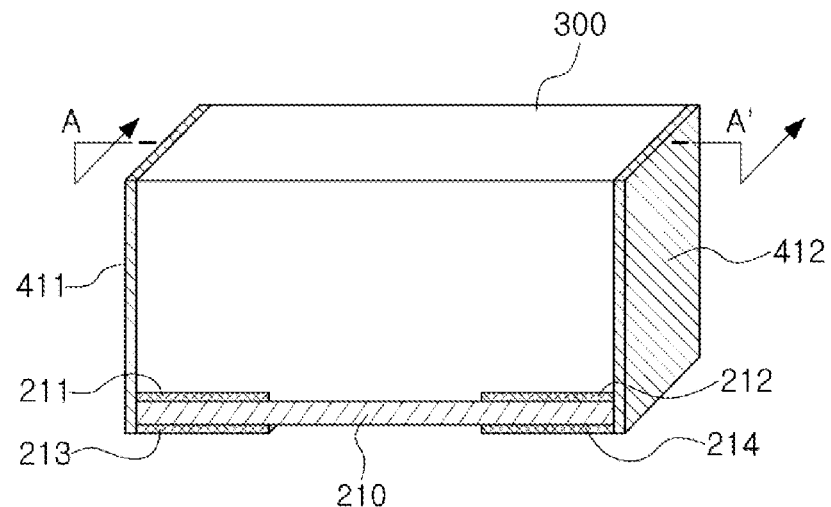
FIG. 1A and FIG. 1B are perspective views of a multilayer ceramic electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Terms with respect to directions will be defined in order to clearly describe exemplary embodiments in the present disclosure. "L," "W" and "T" illustrated in FIG. 5 refer to a length direction, a width direction, and a thickness direction, respectively. Here, the thickness direction may be the same as a direction in which dielectric layers are stacked.

In addition, in the present exemplary embodiment, for convenience of explanation, upper and lower surfaces of a ceramic body refer to surfaces of the ceramic body opposing each other in the thickness direction, and the lower surface of the ceramic body refers to a mounting surface.

Multilayer Ceramic Electronic Component

A multilayer ceramic electronic component, according to an exemplary embodiment, may include a multilayer ceramic capacitor, a board, a sealing part, and connection terminals, and may have a structure in which the multilayer ceramic capacitor is disposed on one surface of the board and is sealed by the sealing part, and contact terminals disposed between the board and the multilayer ceramic capacitor and external terminals disposed on the other surface of the board are exposed outside of the sealing part to be electrically connected to each other by the connection terminals.

Figure 1B:
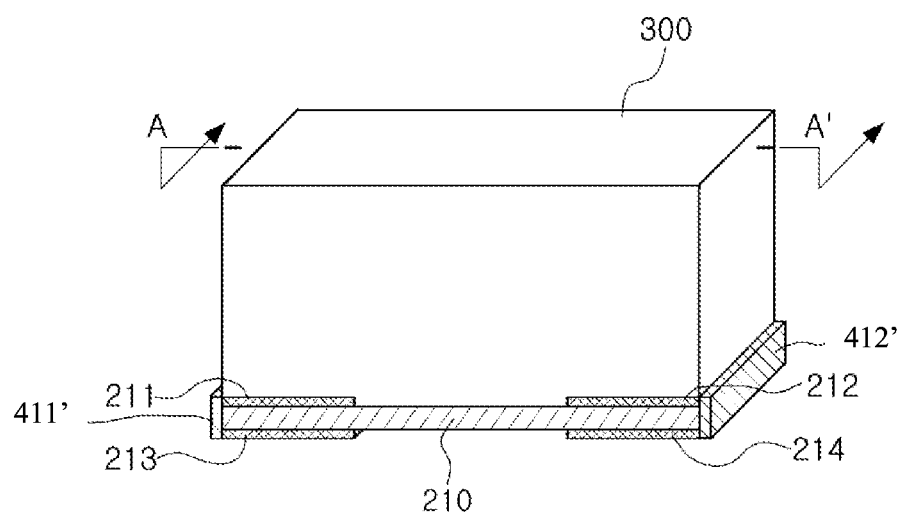
Figure 2:
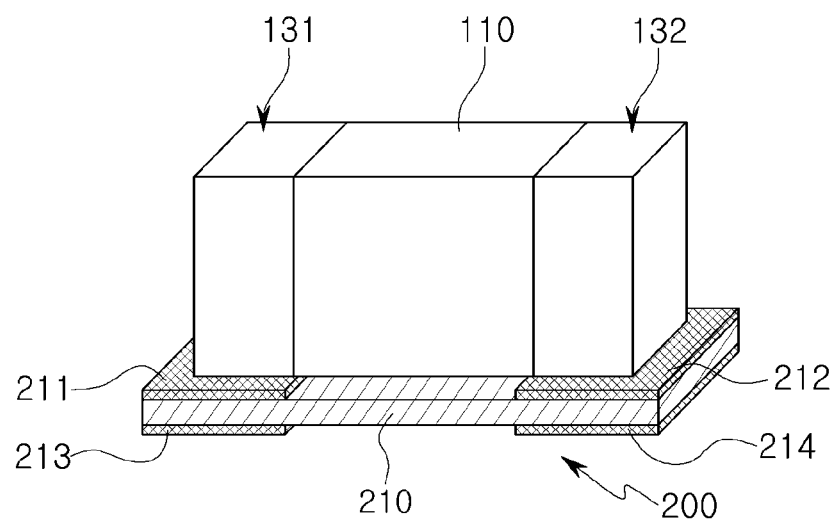
FIG. 2 is a perspective view of the multilayer ceramic electronic component of FIG. 1A from which a sealing part and connection terminals are removed.
Figure 3:
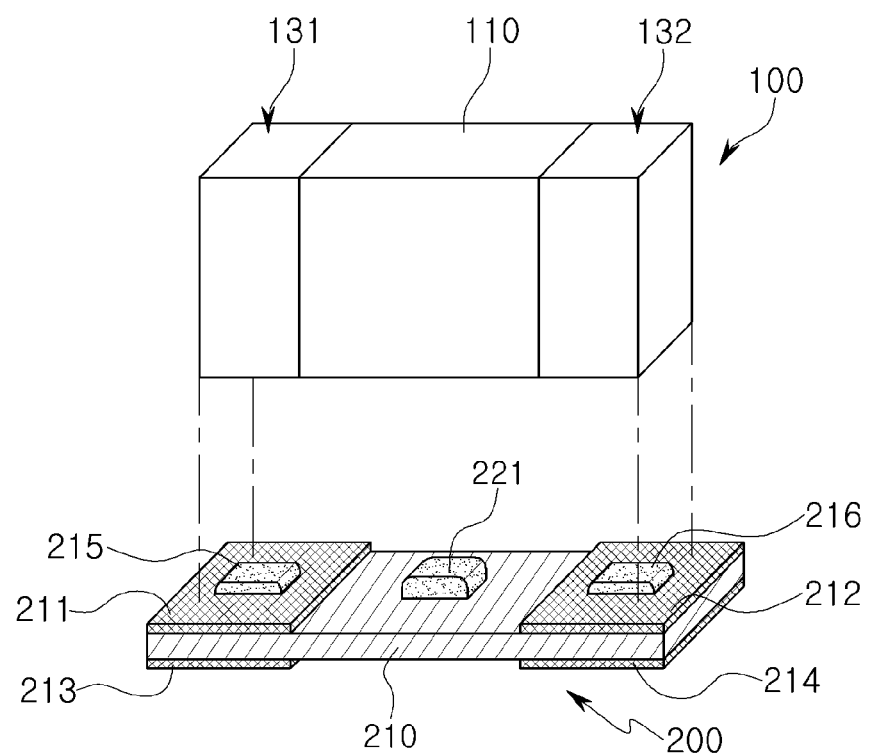
FIG. 3 is an exploded perspective view of the multilayer ceramic electronic component of FIG. 1A from which the sealing part and connection terminals are removed.
Figure 4:
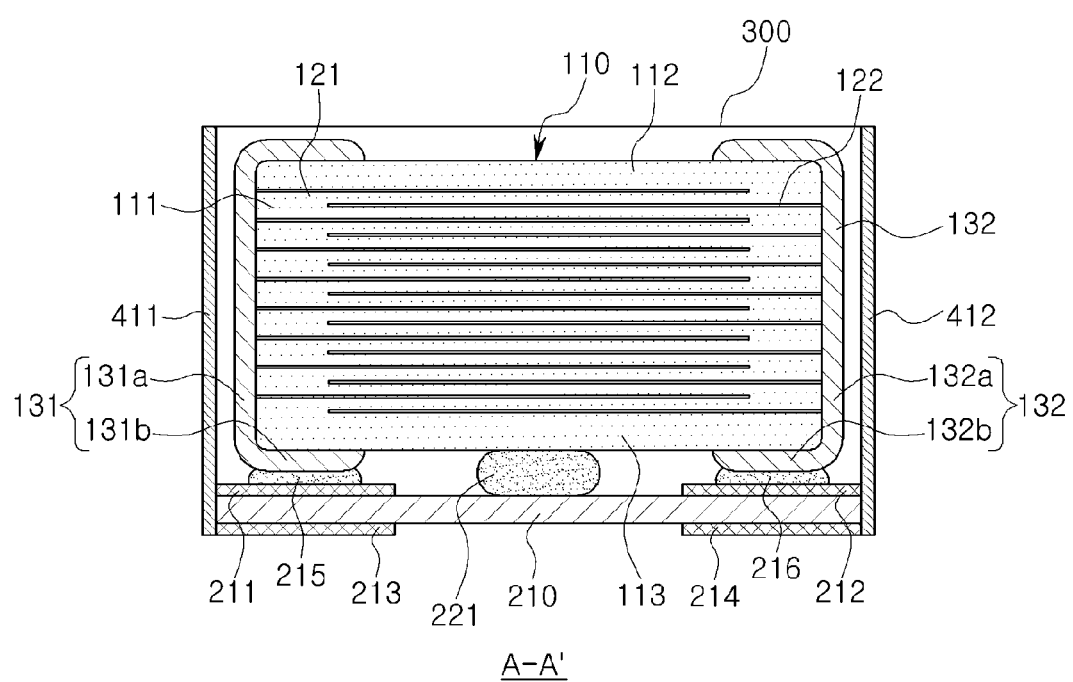
FIG. 4 is a cross-sectional view taken along line A-A' of FIG. 1.

FIGS. 1A and 1B are perspective views of a multilayer ceramic electronic component according to an exemplary embodiment, FIG. 2 is a perspective view of the multilayer ceramic electronic component of FIG. 1A from which a sealing part and connection terminals are removed, FIG. 3 is an exploded perspective view of the multilayer ceramic electronic component of FIG. 1A from which the sealing part and connection terminals are removed, and FIG. 4 is a cross-sectional view taken along line A-A' of FIG. 1A.

Referring to FIGS. 1A through 4, the multilayer ceramic electronic component, according to an exemplary embodiment, may include a multilayer ceramic capacitor 100, a board 200, a sealing part 300, and first and second connection terminals 411 and 412. Here, the multilayer ceramic capacitor 100 may have a size smaller than that of the sealing part 300.

The board 200, according to the present exemplary embodiment, may include a body 210, first and second contact terminals 211 and 212, and first and second external terminals 213 and 214. The board 200 may serve to connect the multilayer ceramic capacitor 100 to an external circuit.

The body 210 may be a hexahedron formed in the length direction, may be formed of an insulating material such as FR4, and may have the multilayer ceramic capacitor 100 mounted on an upper surface thereof.

Here, an insulating adhesive layer 221 may be disposed on one surface of the body 210 to allow the body 210 and a lower surface of a ceramic body to be described below to adhere to each other.

The first and second contact terminals 211 and 212 may be disposed on one surface of the body 210 to be spaced apart from each other in the length direction, and may mechanically contact lower surfaces of first and second band portions of first and second external electrodes, to be described below, of the multilayer ceramic capacitor 100 to thereby be electrically connected to the multilayer ceramic capacitor 100.

The first and second contact terminals 211 and 212 may be formed on one surface of the body 210 by, for example, sputtering.

Here, first and second conductive adhesive layers 215 and 216 may be disposed on one surfaces of the first and second contact terminals 211 and 212, respectively, to bond the first and second contact terminals 211 and 212 and lower surfaces of the first and second band portions of the first and second external electrodes, to be described below, of the multilayer ceramic capacitor 100 to each other and improve bonding strength therebetween.

The first and second conductive adhesive layers 215 and 216 may be formed of a silver (Ag) paste. However, material of the first and second conductive adhesive layers 215 and 216 are not limited thereto.

The first and second external terminals 213 and 214 may be disposed on the other surface of the body 210 to be spaced apart from each other in the length direction, and may be disposed to correspond to the first and second contact terminals 211 and 212, respectively, with the body 210 interposed therebetween.

The first and second external terminals 213 and 214 may be formed on the surface of the body 210 by, for example, sputtering.

In addition, the first and second contact terminals 211 and 212 and the first and second external terminals 213 and 214 disposed to correspond to each other may be electrically connected to each other, respectively. The electrical connection may be made through, for example, a via formed in the body 210, but is not limited thereto.

Figure 5:
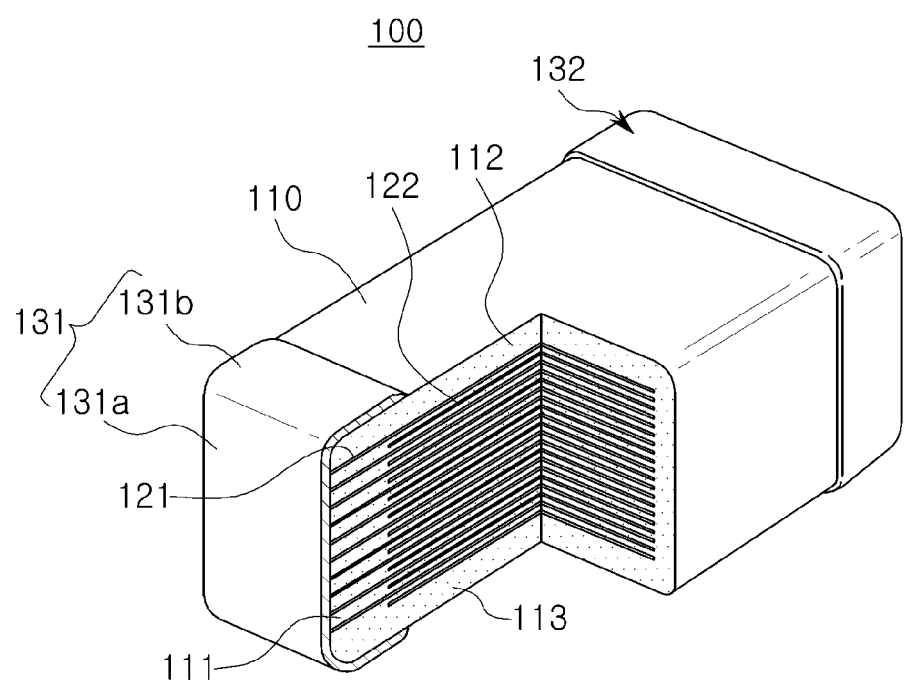
FIG. 5 is a partially cut-away perspective view of a multilayer ceramic capacitor in the multilayer ceramic electronic component of FIG. 1.
Figure 5:
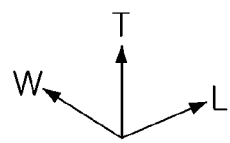

Referring to FIG. 5, the multilayer ceramic capacitor 100, according to the present exemplary embodiment, may include a ceramic body 110, first and second internal electrodes 121 and 122, and first and second external electrodes 131 and 132.

The ceramic body 110 may be formed by stacking and then sintering a plurality of dielectric layers 111. A shape and dimensions of the ceramic body 110 and the number of stacked dielectric layers 111 are not limited to those illustrated in the present exemplary embodiment.

In addition, the plurality of dielectric layers 111 forming the ceramic body 110 may be in a sintered state, and adjacent dielectric layers 111 may be integrated with each other so that boundaries therebetween are not readily apparent without using a scanning electron microscope (SEM).

In addition, the ceramic body 110 may include an active part, a part contributing to forming capacitance of the multilayer ceramic capacitor 100, and upper and lower cover layers 112 and 113 disposed as upper and lower margin parts on upper and lower surfaces of the active part, respectively.

The active part may be formed by repeatedly stacking a plurality of first and second internal electrodes 121 and 122 with one of the dielectric layers 111 interposed therebetween.

Here, a thickness of the dielectric layer 111 may be arbitrarily changed in accordance with a capacitance design of the multilayer ceramic capacitor 100. Preferably, a thickness of one dielectric layer 111 may be 0.01 to 1.00 μm, but is not limited thereto.

In addition, the dielectric layer 111 may contain high-k ceramic powder, such as barium titanate ($BaTiO_3$) based powders or strontium titanate ($SrTiO_3$) based powders. However, a material of the dielectric layer 111 is not limited thereto.

The upper and lower cover layers 112 and 113 may be formed of the same material as that of the dielectric layers 111 of the active part and may have the same configuration as that of the dielectric layers 111 of the active part except that they do not include the internal electrodes.

The upper and lower cover layers 112 and 113 may be formed by stacking a single dielectric layer or two or more dielectric layers on the upper and lower surfaces of the active part, respectively, in the thickness direction, and may basically serve to prevent damage to the first and second internal electrodes 121 and 122 due to physical or chemical stress.

The first and second internal electrodes 121 and 122, electrodes having different polarities, may be formed by printing a conductive paste containing a conductive metal at a predetermined thickness on the dielectric layers 111.

Here, the conductive metal contained in the conductive paste may be nickel (Ni), copper (Cu), palladium (Pd), or an alloy thereof. However, the conductive metal contained in the conductive paste is not limited thereto.

In addition, a method of printing the conductive paste may be a screen printing method, a gravure printing method, or the like, but is not limited thereto.

The first and second internal electrodes 121 and 122 may be alternately stacked in the ceramic body 110 to face each other in a direction in which the dielectric layers 111 are stacked.

Therefore, the first and second internal electrodes 121 and 122 may be disposed to be alternately exposed through opposite end surfaces of the ceramic body 110 in the length direction, respectively, with each of the dielectric layers 111 interposed therebetween. Here, the first and second internal electrodes 121 and 122 may be electrically insulated from each other by each of the dielectric layers 111 disposed therebetween.

In addition, portions of the first and second internal electrodes 121 and 122 alternately exposed through opposite end surfaces of the ceramic body 110 in the length direction, respectively, may be mechanically connected to first and second connection portions 131a and 132a of first and second external electrodes 131 and 132 to be described below, respectively, and thus the first and second internal electrodes 121 and 122 may be electrically connected to the first and second external electrodes 131 and 132, respectively.

Therefore, when voltages are applied to the first and second external electrodes 131 and 132, electric charges may be accumulated between the first and second internal electrodes 121 and 122 facing each other. In this case, capacitance of the multilayer ceramic capacitor 100 may be in proportion to an area of a region in which the first and second internal electrodes 121 and 122 overlap each other in the active part.

The first and second external electrodes 131 and 132 may be formed of a conductive paste including a conductive metal. Here, the conductive metal may be nickel (Ni), copper (Cu), palladium (Pd), gold (Au), or alloys thereof, but is not limited thereto.

In addition, in the present exemplary embodiment, formation of separate plating layers for mounting the multilayer ceramic capacitor on a circuit board on the first and second external electrodes 131 and 132 may be omitted, if necessary. In this case, a problem that reliability of the multilayer ceramic capacitor is deteriorated due to permeation of a plating solution when the plating layers are formed in the related art may be solved.

The first and second external electrodes 131 and 132 may include first and second connection portions 131a and 132a and first and second band portions 131b and 132b, respectively.

The first and second connection portions 131a and 132a may be disposed on opposite end surfaces of the ceramic body 110 in the length direction, respectively, and the first and second band portions 131b and 132b may be extended, respectively, from the first and second connection portions 131a and 132a to portions of the lower surface of the ceramic body 110, which is a mounting surface of the ceramic body 110.

Here, the first and second band portions 131b and 132b may be further extended to portions of at least one of upper and lower surfaces of the ceramic body 110 and opposite side surfaces of the ceramic body 110 in the width direction.

Although a case in which the first and second band portions 131b and 132b of the first and second external electrodes 131 and 132 are extended from the first and second connection portions 131a and 132a to portions of all of the upper and lower surfaces of the ceramic body 110 and opposite side surfaces of the ceramic body 110 in the width direction, respectively, to cover opposite end portions of the ceramic body 110 has been illustrated and described in the present exemplary embodiment, the first and second band portions 131b and 132b of the first and second external electrodes 131 and 132 are not limited thereto.

In addition, the first and second external electrodes 131 and 132 may serve to absorb external mechanical stress, or the like, to prevent generation of cracks in the ceramic body 110 and the first and second internal electrodes 121 and 122.

The sealing part 300 may be formed by injection-molding a material such as an epoxy molding compound (EMC) mold, and may be formed on the board 200 to expose one ends of the first and second contact terminals 211 and 212 and enclose the multilayer ceramic capacitor 100.

The sealing part 300 may improve adhesive strength between the multilayer ceramic capacitor 100 and the board 200.

In addition, the sealing part 300 may serve to suppress stress or vibrations depending on a piezoelectric property of the multilayer ceramic capacitor 100 from being transferred to the board 200 when vibrations are generated in the multilayer ceramic capacitor 100 by voltages applied to the multilayer ceramic capacitor 100, thereby decreasing a magnitude of acoustic noise generated in the circuit board.

The first and second connection terminals 411 and 412 may serve to connect the first and second contact terminals 211 and 212 and the first and second external terminals 213 and 214 to each other, respectively.

The first and second connection terminals 411 and 412, according to the present exemplary embodiment, may be disposed on opposite end surfaces of the sealing part 300 in the length direction, respectively, and may mechanically and electrically connect end portions of the first and second contact terminals 211 and 212 in the length direction, exposed to the outside of the sealing part 300 and end portions of the first and second external terminals 213 and 214 in the length direction, to each other, respectively.

Here, referring to FIG. 1B, the first and second connection terminals 411' and 412' may be disposed on both end surface of the body 210 of the board 200 in the length direction to connect the first and second contact terminals 211 and 212 and first and second external terminals 213 and 214, respectively.

Modified Example

Figure 6:
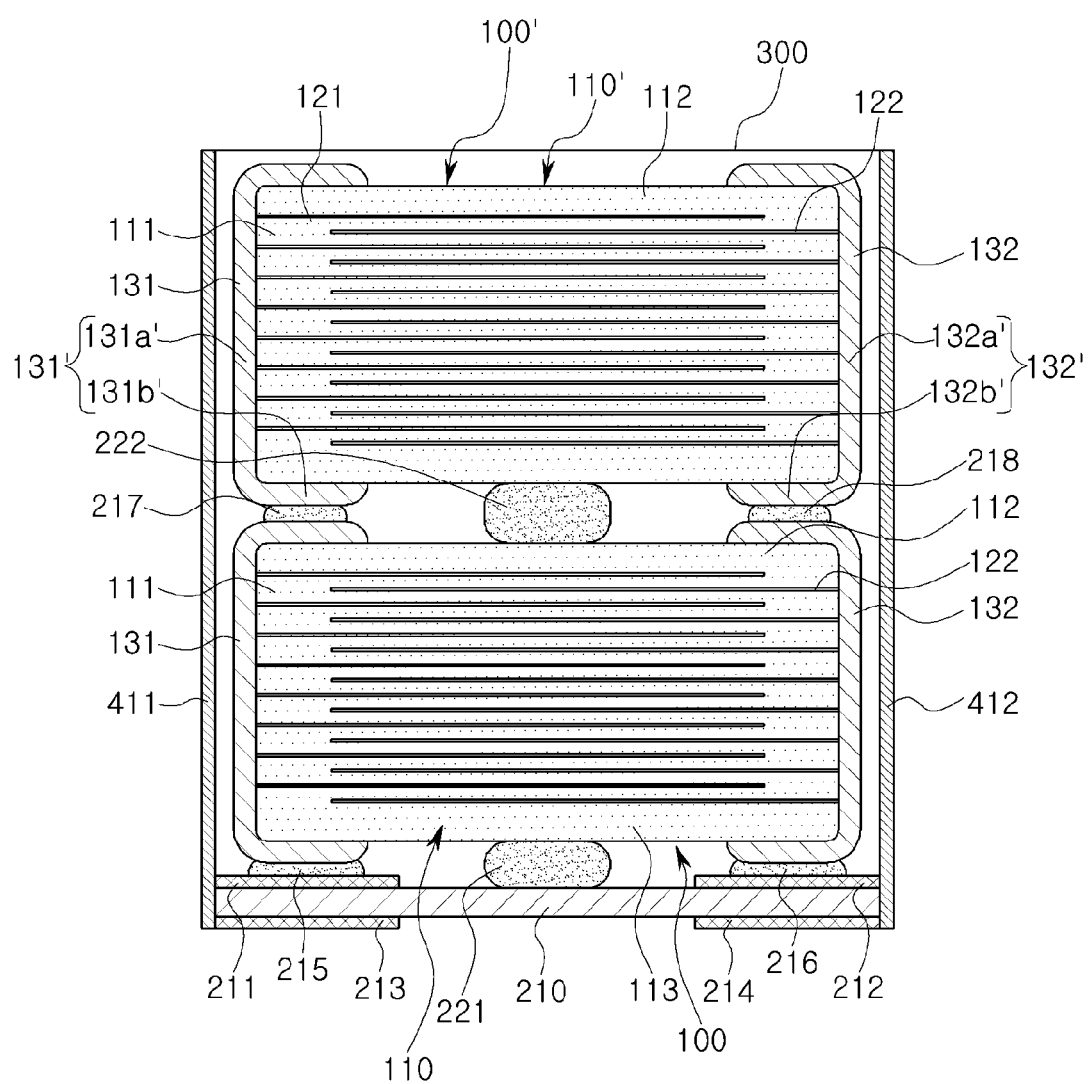
FIG. 6 is a cross-sectional view of a multilayer ceramic electronic component according to another exemplary embodiment in the present disclosure.

FIG. 6 is a cross-sectional view of a multilayer ceramic electronic component according to another exemplary embodiment.

Here, since structures of upper and lower multilayer ceramic capacitors and upper and lower boards are the same as those of the multilayer ceramic capacitor and the board according to the exemplary embodiment described above, a detailed description therefor will be omitted in order to avoid redundancy.

Referring to FIG. 6, two multilayer ceramic capacitors 100' and 100 may be stacked at upper and lower positions, respectively, in the sealing part 300.

Here, an insulating adhesive layer 222 may be disposed between an upper surface of a ceramic body 110 of the lower multilayer ceramic capacitor 100 and a lower surface of a ceramic body 110' of the upper multilayer ceramic capacitor 100' to improve bonding strength between the two multilayer ceramic capacitors 100 and 100'.

In addition, in the lower multilayer ceramic capacitor 100, first and second band portions 131*b* and 132*b* of first and second external electrodes 131 and 132 may be extended from first and second connection portions 131*a* and 132*a* to portions of an upper surface of the ceramic body 110, which is a surface of the ceramic body 110 opposing a mounting surface of the ceramic body 110.

In addition, in the upper multilayer ceramic capacitor 100', first and second band portions 131*b*' and 132*b*' of first and second external electrodes 132' and 132' may be extended from first and second connection portions 131*a*' and 132*a*' to portions of an upper surface of the ceramic body 110', which is a surface of the ceramic body 110' opposing a mounting surface of the ceramic body 110'.

In the present exemplary embodiment, upper surfaces of the first and second band portions 131*b* and 132*b* of the lower multilayer ceramic capacitor 100 and lower surfaces of the first and second band portions 131*b*' and 132*b*' of the upper multilayer ceramic capacitor 100' may contact and be electrically connected to each other, respectively.

Here, conductive adhesive layers 217 and 218 may be disposed between the upper surfaces of the first and second band portions 131*b* and 132*b* of the lower multilayer ceramic capacitor 100 and the lower surfaces of the first and second band portions 131*b*' and 132*b*' of the upper multilayer ceramic capacitor 100', respectively, thereby improving bonding strength and electrical connectivity therebetween.

Meanwhile, as illustrated in FIG. 6, in the upper and lower multilayer ceramic capacitors 100' and 100, the respective band portions may be extended from the connection portions to portions of opposite side surfaces of the ceramic body 110 in the width direction, respectively. However, the respective band portions are not limited thereto.

In addition, although a case in which the two multilayer ceramic capacitors 100 and 100' are stacked at the upper and lower positions, respectively, in the sealing part 300 has been illustrated and described in the present exemplary embodiment, a multilayer ceramic electronic component according to the present disclosure is not limited thereto, and may have a structure in which three or more multilayer ceramic capacitors are stacked, if necessary.

In the present exemplary embodiment, a plurality of multilayer ceramic capacitors may be stacked at the upper and lower positions, respectively, in the sealing part, thereby decreasing acoustic noise.

In addition, in a case of a stack type capacitor using a metal frame according to the related art, a height of the stack type capacitor is increased by a height of the metal frame, and thus a center of gravity thereof is positioned at a high place, whereby the capacitor may collapse. However, in a case of the present exemplary embodiment, an entire height of the multilayer ceramic electronic component is relatively low, and thus the center of gravity of the multilayer ceramic electronic component is positioned at a comparatively low place, whereby a collapse of the multilayer ceramic electronic component may be prevented when the multilayer ceramic electronic component is mounted.

Figure 7:
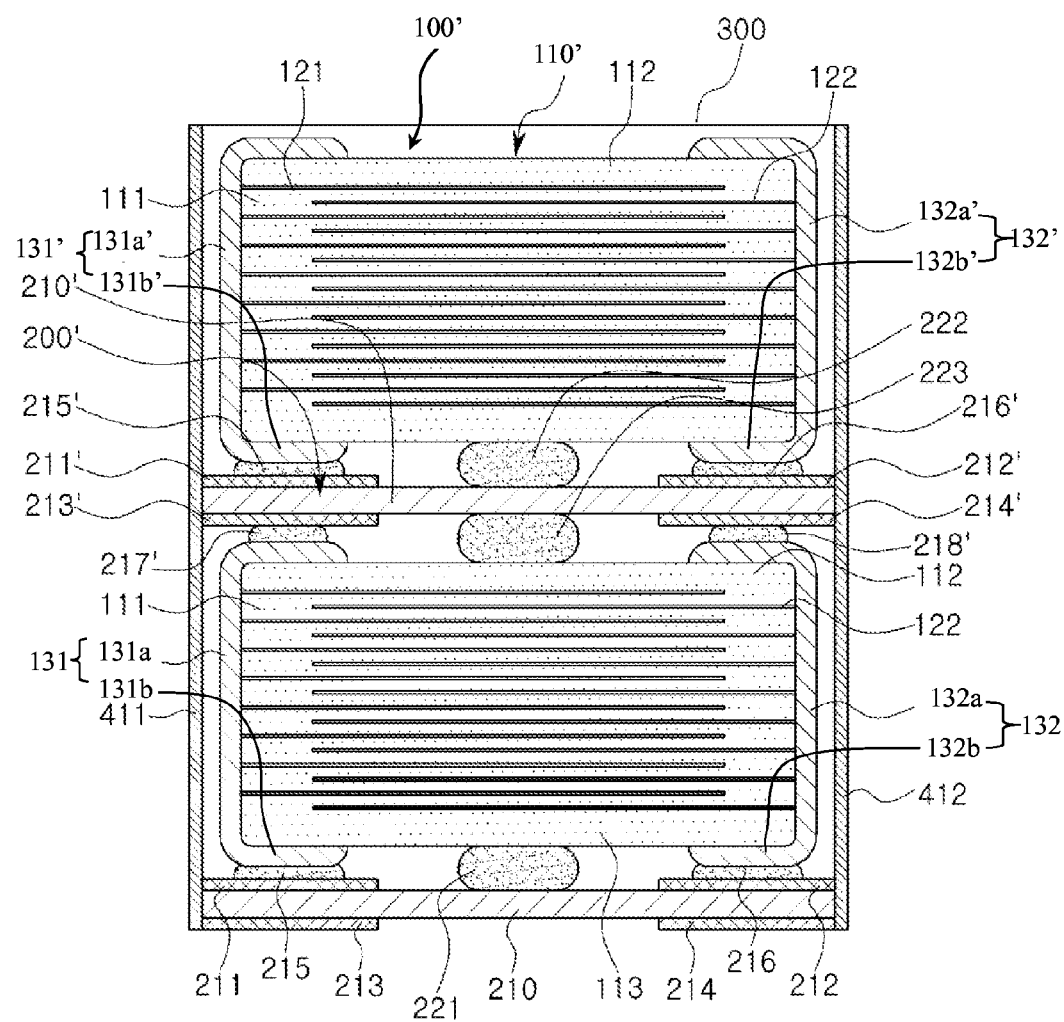
FIG. 7 is a cross-sectional view of a multilayer ceramic electronic component according to another exemplary embodiment in the present disclosure.

FIG. 7 is a cross-sectional view of a multilayer ceramic electronic component according to another exemplary embodiment in the present disclosure.

Here, since structures of upper and lower multilayer ceramic capacitors and upper and lower boards are the same as those of the multilayer ceramic capacitor and the board according to the exemplary embodiment described above, a detailed description therefor will be omitted in order to avoid redundancy.

Referring to FIG. 7, two multilayer ceramic capacitors 100' and 100 may be stacked at upper and lower positions, respectively, in the sealing part 300, and an intermediate board 200' may be disposed between the upper and lower multilayer ceramic capacitors 100' and 100. A structure of the intermediate board 200' may be the same as that of the board 200 according to the exemplary embodiment described above.

Here, insulating adhesive layers 222 and 223 may be disposed between an upper surface of a ceramic body 110 of the lower multilayer ceramic capacitor 100 and a lower surface of the intermediate board 200' and between a lower surface of a ceramic body 110' of the upper multilayer ceramic capacitor 100' and an upper surface of the intermediate board 200', respectively, to improve bonding strength between the two multilayer ceramic capacitors 100 and 100'.

In addition, in the lower multilayer ceramic capacitor 100, first and second band portions 131*b* and 132*b* of first and second external electrodes 131 and 132 may be extended, respectively, from first and second connection portions 131*a* and 132*a* to portions of an upper surface of the ceramic body 110, which is a surface of the ceramic body 110 opposite a mounting surface of the ceramic body 110.

In addition, in the upper multilayer ceramic capacitor 100', first and second band portions 131*b*' and 132*b*' of first and second external electrodes 131' and 132' may be extended, respectively, from first and second connection portions 131*a*' and 132*a*' to portions of an upper surface of the ceramic body 110', which is a surface of the ceramic body 110' opposite a mounting surface of the ceramic body 110'.

In the present exemplary embodiment, upper surfaces of the first and second band portions 131*b* and 132*b* of the lower multilayer ceramic capacitor 100 and first and second external terminals 213' and 214' of the intermediate board 200' may contact and be electrically connected to each other, respectively, and lower surfaces of the first and second band portions 131b' and 132b' of the upper multilayer ceramic capacitor 100' and first and second contact terminals 211' and 212' of the intermediate board 200' may contact and be electrically connected to each other, respectively.

Here, conductive adhesive layers 217' and 218' may be disposed between the upper surfaces of the first and second band portions 131b and 132b of the lower multilayer ceramic capacitor 100 and the first and second external terminals 213' and 214' of the intermediate board 200', respectively, and conductive adhesive layers 215' and 216' may be disposed between the lower surfaces of the first and second band portions 131b' and 132b' of the upper multilayer ceramic capacitor 100' and the first and second contact terminals 211' and 212' of the intermediate board 200', respectively. In this case, bonding strength and electrical connectivity between the multilayer ceramic capacitor 100' and the intermediate board 200' may be improved.

Meanwhile, as illustrated in FIG. 7, in the upper and lower multilayer ceramic capacitors 100' and 100, the respective band portions may be extended from the connection portions to portions of both side surfaces of the ceramic body 110 in the width direction, respectively. However, the respective band portions are not limited thereto.

In addition, although a case in which the two multilayer ceramic capacitors 100' and 100 are stacked at the upper and lower positions, respectively, in the sealing part 300, respectively, has been illustrated and described in the present disclosure, a multilayer ceramic electronic component according to the exemplary embodiment is not limited thereto, and may have a structure in which three or more multilayer ceramic capacitors and two or more intermediate boards are stacked, if necessary.

Figure 9:
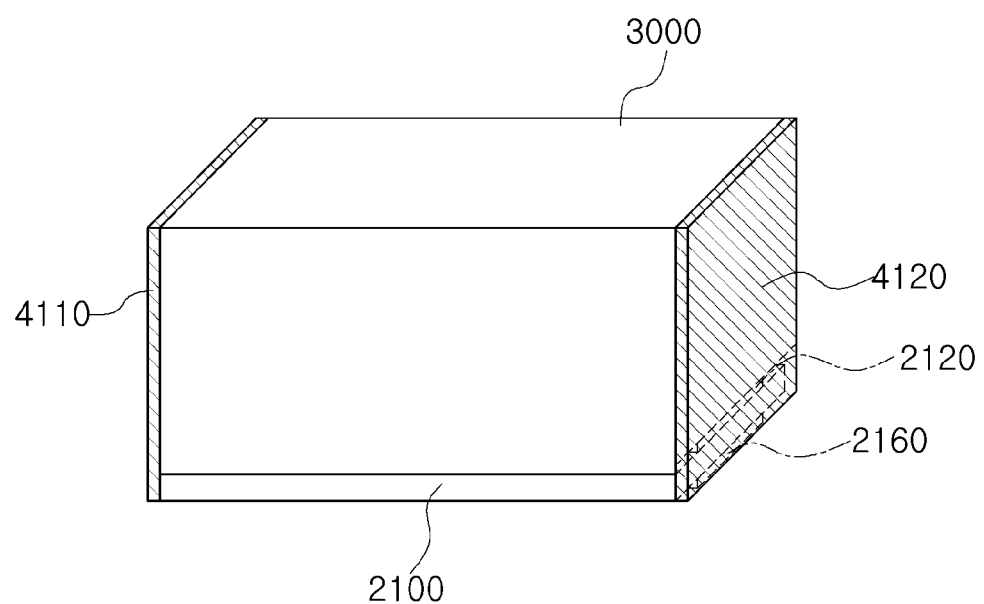
FIG. 9 is a perspective view of a multilayer ceramic electronic component according to another exemplary embodiment in the present disclosure.
Figure 10:
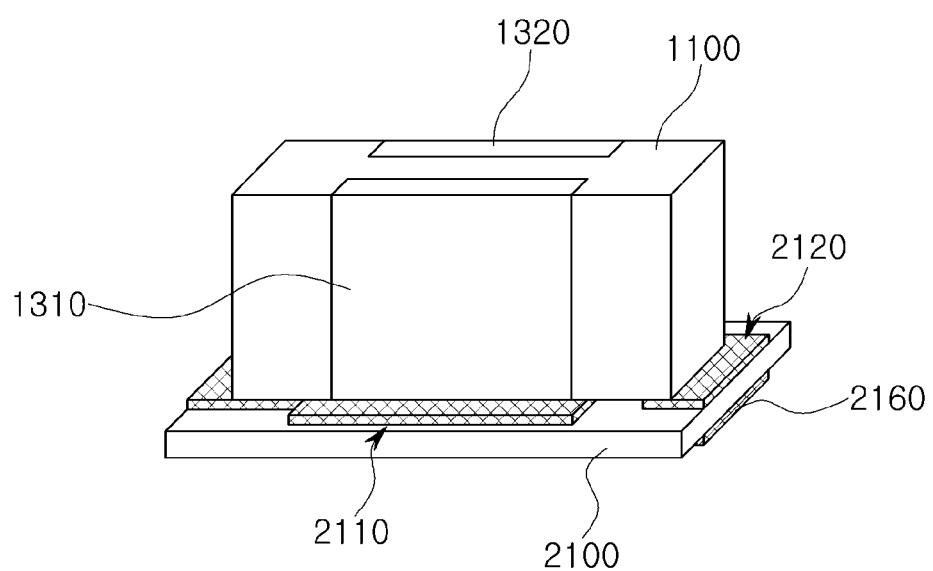
FIG. 10 is a perspective view of the multilayer ceramic electronic component of FIG. 9 from which a sealing part and connection terminals are removed.
Figure 11:
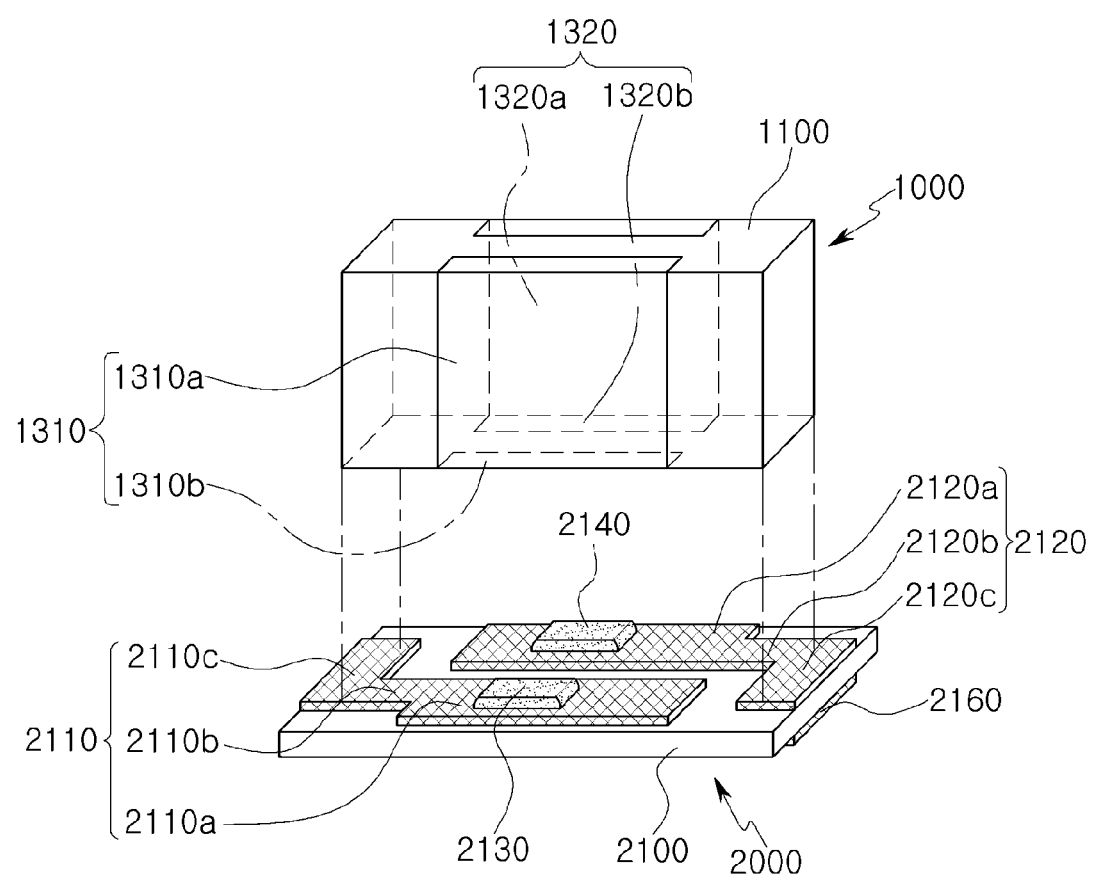
FIG. 11 is an exploded perspective view of the multilayer ceramic electronic component of FIG. 9 from which the sealing part and connection terminals are removed.
Figure 12:
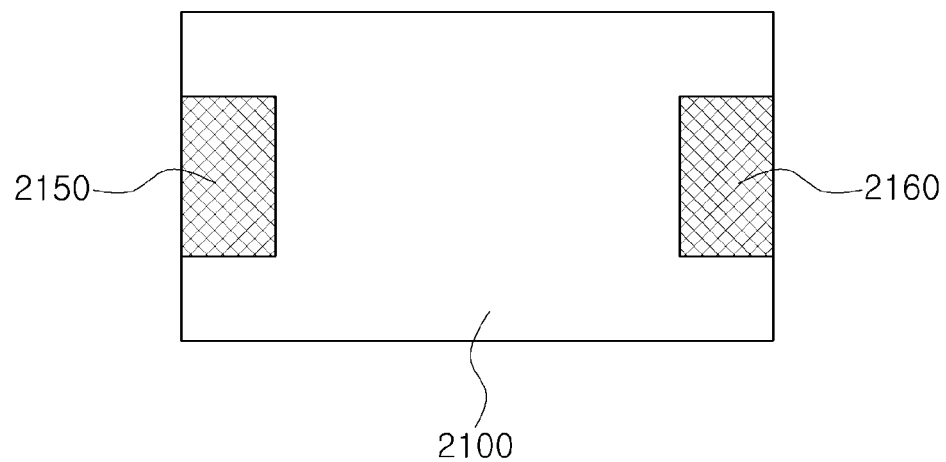
FIG. 12 is a bottom view of a board of FIG. 9.

FIG. 9 is a perspective view schematically illustrating a multilayer ceramic electronic component according to another exemplary embodiment, FIG. 10 is a perspective view of the multilayer ceramic electronic component of FIG. 9 from which a sealing part and connection terminals are removed, FIG. 11 is an exploded perspective view of the multilayer ceramic electronic component of FIG. 9 from which the sealing part and connection terminals are removed, and FIG. 12 is a bottom view of a board of FIG. 9.

Here, a detailed description for components those are the same as those according to the first exemplary embodiment described above will be omitted in order to avoid redundancy.

Referring to FIGS. 9 through 12, the multilayer ceramic electronic component, according to another exemplary embodiment, may include a multilayer ceramic capacitor 1000, a board 2000, a sealing part 3000, and first and second connection terminals 4110 and 4120.

The board 2000, according to the present exemplary embodiment, may include a body 2100, first and second contact terminals 2110 and 2120, and first and second external terminals 2150 and 2160.

Here, an insulating adhesive layer (not illustrated) may be disposed on one surface of the body 2100, if necessary, to allow the body 2100 and a lower surface of a ceramic body 1100 of the multilayer ceramic capacitor 1000 to adhere to each other.

The first and second contact terminals 2110 and 2120 may include first and second mounting portions 2110a and 2120a, first and second contact portions 2110c and 2120c, and first and second connecting portions 2110b and 2120b each connecting the first and second mounting portions 2110a and 2120a and the first and second contact portions 2110c and 2120c to each other, respectively.

The first and second mounting portions 2110a and 2120a may be disposed on one surface of the body 2100 to be spaced apart from each other in the width direction, and may mechanically contact lower surfaces of first and second band portions 1310b and 1320b of first and second external electrodes 1310 and 1320, respectively, to thereby be electrically connected to the multilayer ceramic capacitor 1000.

Here, first and second conductive adhesive layers 2130 and 2140 may be disposed on one surfaces of the first and second mounting portions 2110a and 2120a, respectively, to improve bonding strength between the first and second mounting portions 2110a and 2120a and the lower surfaces of the first and second band portions 1310b and 1320b of the first and second external electrodes 1310 and 1320 included in the multilayer ceramic capacitor 1000.

The first and second contact portions 2110c and 2120c may be disposed on one surface of the body 2100 to be adjacent to opposite ends of the body 2100 in the length direction, respectively, and have distal ends exposed to opposite ends of the body 2100 in the length direction, respectively.

The first and second external terminals 2150 and 2160 may be disposed on the other surface of the body 2100 to be spaced apart from each other in the length direction, and may be disposed to correspond to the first and second contact portions 2110c and 2120c of the first and second contact terminals 2110 and 2120, respectively, with the body 2100 interposed therebetween.

Figure 13:
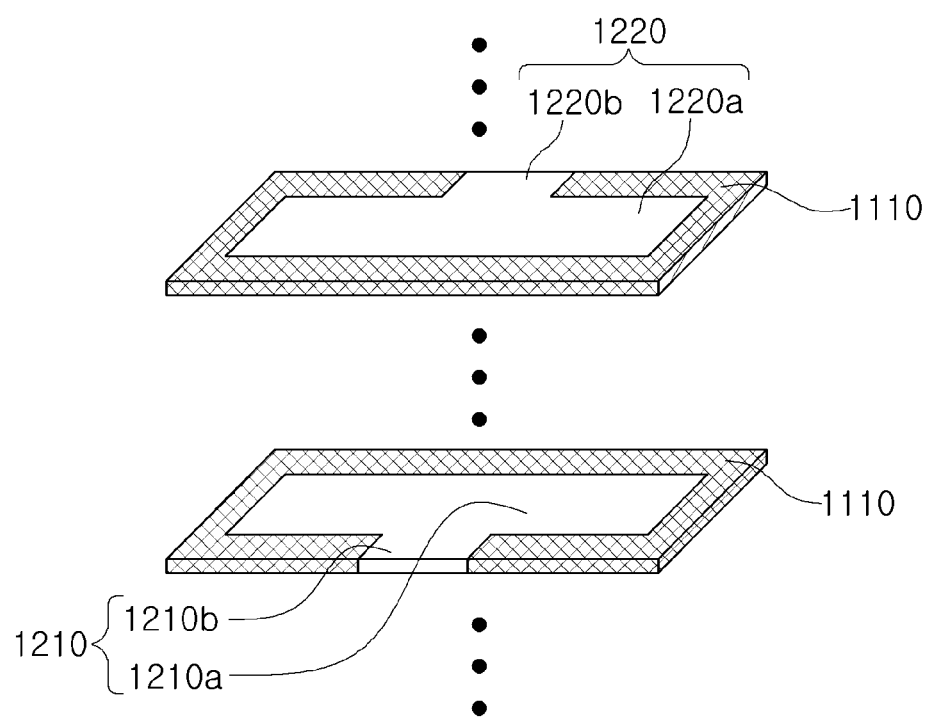
FIG. 13 is an exploded perspective view of structures of internal electrodes of a multilayer ceramic capacitor in the multilayer ceramic electronic component of FIG. 9.

Referring to FIG. 13, the multilayer ceramic capacitor 1000, according to the present exemplary embodiment, may include a ceramic body 1100, first and second internal electrodes 1210 and 1220, and first and second external electrodes 1310 and 1320.

The first and second internal electrodes 1210 and 1220 may be alternately stacked in the ceramic body 1100 to face each other in a direction in which dielectric layers 1110 are stacked, with one of the dielectric layers 1110 interposed therebetween.

The first and second internal electrodes 1210 and 1220 may include first and second body portions 1210a and 1220a overlapping each other and forming capacitance of the multilayer ceramic capacitor 1000, and first and second lead portions 1210b and 1220b, respectively.

The first and second lead portions 1210b and 1220b may be extended from the first and second body portions 1210a and 1220a to be alternately exposed through opposite side surfaces of the ceramic body 1100 in the width direction, respectively, and may mechanically contact and be electrically connected to first and second connection portions 1310a and 1320a of the first and second external electrodes 1310 and 1320 disposed on opposite side surfaces of the ceramic body 1100 in the width direction, respectively.

The first and second external electrodes 1310 and 1320 may include the first and second connection portions 1310a and 1320a and the first and second band portions 1310b and 1320b, respectively.

Here, the first and second band portions 1310b and 1320b may be extended to portions of an upper surface of the ceramic body 1100, if necessary.

The first and second connection portions 1310a and 1320a may be disposed to opposite side surfaces of the ceramic body 1100 in the width direction, respectively, and serve to be connected to the first and second lead portions 1210b and 1220b, respectively, and the first and second band portions 1310b and 1320b may be extended from the first and second connection portions 1310a and 1320a to portions of a lower surface of the ceramic body 1100, which is a mounting surface of the ceramic body 1100, respectively, and may serve to be connected to the first and second mounting portions 2110a and 2120a of the first and second contact terminals 2110 and 2120 of the board 2000, respectively.

The sealing part 3000 may be formed on the board 2000 to expose the distal ends of the first and second contact portions 2110c and 2120c of the first and second contact terminals 2110 and 2120 and enclose the multilayer ceramic capacitor 1000.

The first and second connection terminals 4110 and 4120 may serve to connect the first and second contact terminals 2110 and 2120 and the first and second external terminals 2150 and 2160, respectively.

The first and second connection terminals 4110 and 4120, according to the present exemplary embodiment, may be disposed on opposite end surfaces of the sealing part 3000 in the length direction, respectively, and may mechanically and electrically connect the distal ends of the first and second contact portions 2110c and 2120c of the first and second contact terminals 2110 and 2120 exposed to the outside of the sealing part 3000 and distal ends of the first and second external terminals 2150 and 2160 to each other, respectively.

Board Having Multilayer Ceramic Electronic Component

Figure 14:
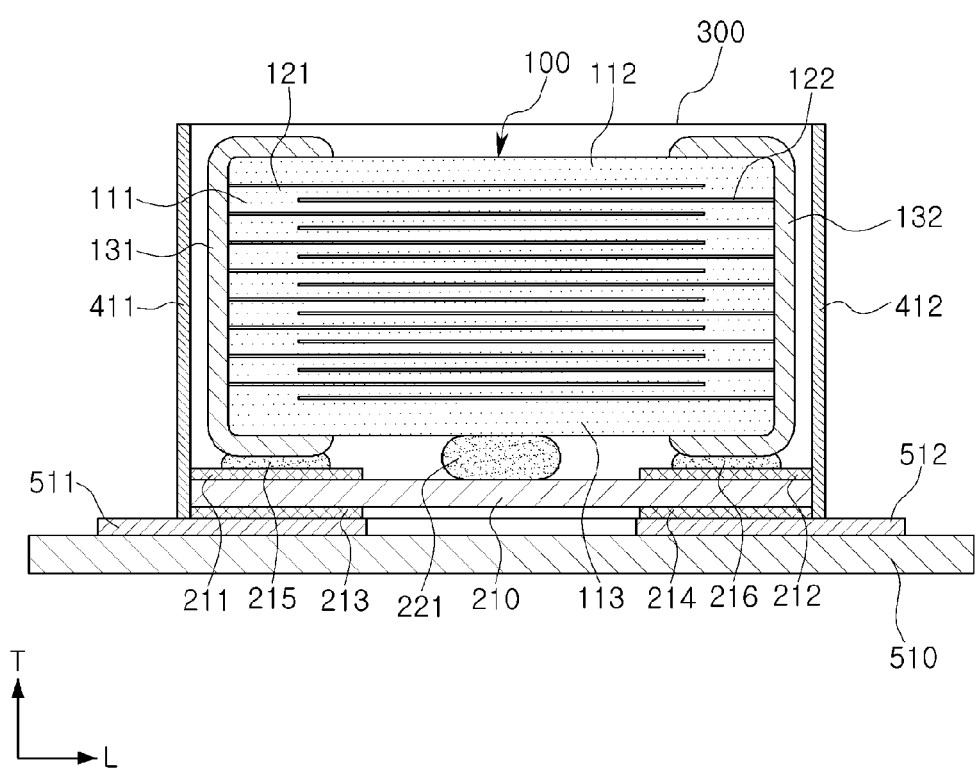
FIG. 14 is a cross-sectional view of a board in which the multilayer ceramic electronic component of FIG. 1A is mounted on a circuit board, cut in a length-thickness direction.

FIG. 14 is a cross-sectional view of a board in which the multilayer ceramic electronic component of FIG. 1 is mounted on a circuit board, cut in a length-thickness direction.

Referring to FIG. 14, a board 200 having a multilayer ceramic electronic component according to the present exemplary embodiment may include a circuit board 510 on which the multilayer ceramic electronic component 100 is mounted in parallel with the circuit board 510 and first and second electrode pads 511 and 512 formed on an upper surface of the circuit board 510 to be spaced apart from each other.

Here, the multilayer ceramic electronic component 100 may be attached to the circuit board 510 and may be electrically connected to the circuit board 510 in a state in which the board 200 is disposed below the multilayer ceramic capacitor 100 and the first and second external terminals 213 and 214 are positioned on the first and second electrode pads 511 and 512, respectively, to contact the first and second electrode pads 511 and 512, respectively.

When voltage is applied to the multilayer ceramic electronic component 100 in a state in which the multilayer ceramic electronic component 100 is mounted on the circuit board 510, acoustic noise may be generated.

Here, sizes of the first and second electrode pads 511 and 512 may be important in determining an amount of solder connecting the first and second external electrodes 131 and 132 of the multilayer ceramic capacitor 100, the first and second external terminals 213 and 214 of the board 200, and the first and second electrode pads 511 and 512 to each other, respectively, and a magnitude of the acoustic noise may be controlled depending on the amount of the solder.

Figure 8:
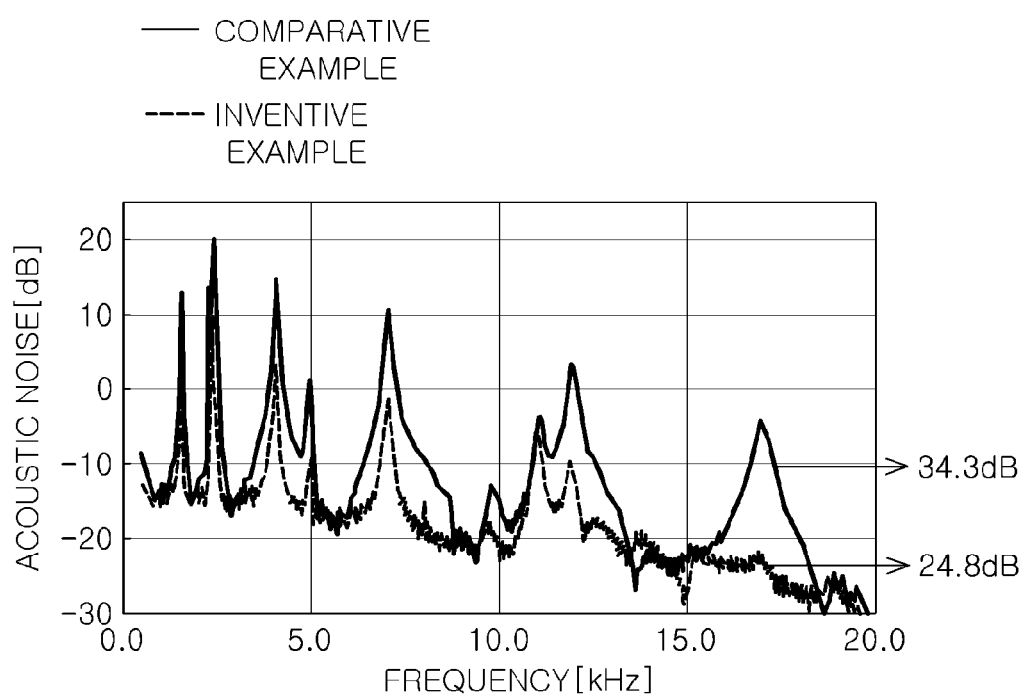
FIG. 8 is a graph for comparing acoustic noise of a multilayer ceramic electronic component according to an Inventive Example and acoustic noise of a multilayer ceramic electronic component according to a Comparative Example.

FIG. 8 is a graph for comparing acoustic noise of a multilayer ceramic electronic component according to an Inventive Example and acoustic noise of a multilayer ceramic electronic component according to a Comparative Example. In the Comparative Example, no board and sealing part were provided. In each of the Inventive Example and the Comparative Example, length*breadth of the multilayer ceramic electronic component may be 1.6 mm*0.8 mm.

In the graph of FIG. 8, magnitudes of noise generated in each of the Inventive Example and the Comparative Example when a sine wave having a frequency range 300 Hz to 20 kHz at a magnitude of 3.15Vdc+2Vpp was input were measured and compared with each other.

Referring to the graph of FIG. 8, in a case of a multilayer ceramic capacitor according to the Comparative Example, average acoustic noise was 34.3 dB, and in a case of a mold type multilayer ceramic capacitor according to the Inventive Example, acoustic noise was 24.8 dB, which is relatively lower than the acoustic noise of the multilayer ceramic capacitor according to the Comparative Example.

Therefore, in Inventive Example, stress or vibrations depending on a piezoelectric property of the multilayer ceramic capacitor may be alleviated by the board and the sealing part, and thus a magnitude of the acoustic noise generated in the circuit board may be decreased.

In addition, in a case in which the multilayer ceramic capacitor is surface-mounted on the circuit board, a step is present between the external electrodes and the ceramic body, and thus an error rate is high. However, according to an exemplary embodiment, since the external terminals on a relatively flat board and the circuit board are connected to each other, an error rate at the time of surface-mounting the multilayer ceramic capacitor on the circuit board may be decreased.

In addition, according to an exemplary embodiment, warpage resistance of the multilayer ceramic electronic component may be improved by a combination of the board having elasticity and the sealing part, and thus the multilayer ceramic electronic component may be usefully implemented in a field in which large mechanical stress is applied.

As set forth above, according to exemplary embodiments, stress or vibrations depending on the piezoelectric property of the multilayer ceramic capacitor may be alleviated by the board and the sealing part, and thus a magnitude of the acoustic noise may be decreased when the multilayer ceramic electronic component is mounted on the circuit board.

In addition, since the multilayer ceramic capacitor is enclosed by the sealing part, even if plating is not performed on the external electrodes, resistance to external moisture is higher than that of the multilayer ceramic capacitor according to the related art, and thus reliability of the multilayer ceramic electronic component may be improved.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
   a board including first and second contact terminals which are disposed on one surface thereof to be spaced apart from each other in a length direction, and first and second external terminals which are disposed on the other surface thereof to be spaced apart from each other in the length direction;
   a multilayer ceramic capacitor including first and second external electrodes including first and second connection portions which are disposed on opposite end surfaces of a ceramic body and first and second band portions which extend from the first and second connection portions to portions of one surface of the ceramic body in a thickness direction thereof, respectively, the first and second band portions being connected to the first and second contact terminals of the board, respectively;
a sealing part enclosing the multilayer ceramic capacitor on the board while exposing one ends of the first and second contact terminals; and
first and second connection terminals connecting the exposed ends of the first and second contact terminals and the first and second external terminals to each other, respectively.

2. The multilayer ceramic electronic component of claim 1, wherein the first and second connection terminals extend to cover opposite end surfaces of the sealing part, respectively.

3. The multilayer ceramic electronic component of claim 1, wherein the multilayer ceramic capacitor includes a plurality of first and second internal electrodes stacked in the ceramic body to be alternately exposed through the opposite end surfaces of the ceramic body, respectively, with at least one of dielectric layers interposed therebetween, and connected to the first and second connection portions, respectively.

4. The multilayer ceramic electronic component of claim 1, further comprising first and second conductive adhesive layers disposed between the first and second contact terminals of the board and the first and second band portions of the first and second external electrodes, respectively.

5. The multilayer ceramic electronic component of claim 1, further comprising an insulating adhesive layer disposed between the board and one surface of the ceramic body in the thickness direction.

6. The multilayer ceramic electronic component of claim 1, wherein the first and second band portions of the first and second external electrodes extend from the first and second connection portions to portions of the other surface of the ceramic body in the thickness direction, respectively, and
the multilayer ceramic capacitor comprises a plurality of multilayer ceramic capacitors which are stacked and connected to each other through band portions of external electrodes facing each other.

7. The multilayer ceramic electronic component of claim 6, wherein the plurality of multilayer ceramic capacitors include conductive adhesive layers between the band portions facing each other.

8. The multilayer ceramic electronic component of claim 6, wherein the plurality of multilayer ceramic capacitors further include an intermediate board disposed between the band portions facing each other and including contact terminals and external terminals.

9. A multilayer ceramic electronic component comprising:
a board including first and second contact terminals which are disposed on one surface thereof to be spaced apart from each other and first and second external terminals disposed on the other surface thereof to be spaced apart from each other;
a multilayer ceramic capacitor including first and second external electrodes including first and second connection portions which are disposed on opposite side surfaces of a ceramic body and first and second band portions which extend from the first and second connection portions to portions of one surface of the ceramic body in a thickness direction thereof, respectively, the first and second band portions being connected to the first and second contact terminals, respectively;
a sealing part enclosing the multilayer ceramic capacitor the board while exposing one ends of the first and second contact terminals; and
first and second connection terminals connecting the exposed ends of the first and second contact terminals and the first and second external terminals to each other, respectively.

10. The multilayer ceramic electronic component of claim 9, wherein the first and second contact terminals include:
first and second mounting portions disposed to be spaced apart from each other and connected to the first and second band portions, respectively;
first and second contact portions exposed to opposite ends of the board, respectively; and
first and second connecting portions connecting the first and second mounting portions and the first and second contact portions to each other, respectively.

11. The multilayer ceramic electronic component of claim 10, further comprising first and second conductive adhesive layers disposed between the first and second mounting portions of the first and second contact terminals and the first and second band portions of the first and second external electrodes, respectively.

12. The multilayer ceramic electronic component of claim 11, further comprising an insulating adhesive layer disposed between the board and one surface of the ceramic body in the thickness direction.

13. The multilayer ceramic electronic component of claim 9, wherein the first and second connection terminals are disposed on opposite end surfaces of the sealing part, respectively.

14. The multilayer ceramic electronic component of claim 9, wherein the multilayer ceramic capacitor includes a plurality of first and second internal electrodes alternately stacked in the ceramic body to face each other with at least one of dielectric layers interposed therebetween, and
the first and second internal electrodes include first and second body portions overlapping each other and first and second lead portions extending from the first and second body portions to be exposed through opposite side surfaces of the ceramic body and connected to the first and second connection portions of the first and second external electrodes, respectively.

15. A multilayer ceramic electronic component comprising:
a board including an electrically insulating body, first and second contact terminals disposed on one surface of the electrically insulating body, and first and second external terminals disposed on another surface of the electrically insulating body opposite to the one surface;
a multilayer ceramic capacitor disposed on the board and including first and second external electrodes including first and second connection portions which are disposed on opposite end surfaces of a ceramic body and first and second band portions which extend from the first and second connection portions to portions of one surface of the ceramic body, respectively, the first and second band portions being connected to the first and second contact terminals of the board, respectively;
a sealing part; and
first and second connection terminals connecting the first and second contact terminals of the board and the first and second external terminals of the board to each other, respectively,
wherein the multilayer ceramic capacitor is surrounded by the sealing part and the board.

16. The multilayer ceramic electronic component of claim 15, wherein the first and first and second connection terminals extend from the electrically insulating body of the board to cover opposite side surfaces of the sealing part, respectively.

17. The multilayer ceramic electronic component of claim 16, wherein the multilayer ceramic capacitor comprises a plurality of multilayer ceramic capacitors which are stacked on one another on the board and are electrically connected to each other through band portions of external electrodes facing each other.

18. The multilayer ceramic electronic component of claim 15, wherein the multilayer ceramic capacitor includes a plurality of first and second internal electrodes stacked in the ceramic body to be alternately exposed through the opposite end surfaces of the ceramic body, respectively, with at least one of dielectric layers interposed therebetween, and connected to the first and second connection portions, respectively.

19. The multilayer ceramic electronic component of claim 15, further comprising an insulating adhesive layer disposed between the board and one surface of the ceramic body in the thickness direction.

20. The multilayer ceramic electronic component of claim 15, wherein the first and second connection terminals are contact vias penetrating through the electrically insulating body of the board.

* * * * *